(12) United States Patent
Inoue

(10) Patent No.: US 8,431,908 B2
(45) Date of Patent: Apr. 30, 2013

(54) CHARGED PARTICLE BEAM WRITING APPARATUS AND CHARGED PARTICLE BEAM WRITING METHOD

(75) Inventor: Hideo Inoue, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/351,786

(22) Filed: Jan. 17, 2012

(65) Prior Publication Data

US 2012/0187307 A1    Jul. 26, 2012

(30) Foreign Application Priority Data

Jan. 20, 2011   (JP) .................................. 2011-009812

(51) Int. Cl.
G21K 1/087    (2006.01)

(52) U.S. Cl.
USPC .... 250/396 R; 250/397; 250/398; 250/492.1; 250/492.21; 250/492.22; 250/492.3; 341/120; 341/141

(58) Field of Classification Search .............. 250/396 R, 250/397, 398, 492.1, 492.21, 492.22, 492.3
See application file for complete search history.

(56) References Cited

U.S. PATENT DOCUMENTS

| | | | |
|---|---|---|---|
| 4,660,086 A * | 4/1987 | Lemelson ...................... 348/135 |
| 6,915,517 B1 * | 7/2005 | Imamura et al. .............. 718/103 |
| 7,504,645 B2 * | 3/2009 | Anpo et al. ............... 250/492.22 |
| 7,589,335 B2 * | 9/2009 | Matsukawa et al. ..... 250/492.22 |
| 7,741,614 B2 | 6/2010 | Inoue |
| 7,750,324 B2 * | 7/2010 | Oogi et al. ................ 250/492.22 |
| 7,899,953 B2 | 3/2011 | Inoue |
| 7,923,699 B2 * | 4/2011 | Inoue ............................. 250/398 |
| 7,989,777 B2 * | 8/2011 | Goshima ................... 250/396 R |
| 8,247,783 B2 * | 8/2012 | Nishimura ................ 250/396 R |
| 8,277,603 B2 * | 10/2012 | Tamamushi et al. ........ 156/345.4 |
| 2007/0152169 A1 * | 7/2007 | Tamamushi et al. ........ 250/492.1 |
| 2008/0006777 A1 | 1/2008 | Inoue |
| 2008/0011965 A1 * | 1/2008 | Matsukawa et al. .......... 250/398 |
| 2008/0265174 A1 * | 10/2008 | Hiramoto et al. ............. 250/398 |
| 2009/0057575 A1 * | 3/2009 | Oogi et al. ............... 250/492.22 |
| 2009/0084990 A1 * | 4/2009 | Nishimura et al. ....... 250/492.22 |

(Continued)

FOREIGN PATENT DOCUMENTS

JP    2007-43083    2/2007

OTHER PUBLICATIONS

U.S. Appl. No. 13/431,509, filed Mar. 27, 2012, Inoue.

*Primary Examiner* — David A Vanore
(74) *Attorney, Agent, or Firm* — Oblon, Spivak, McClelland, Maier & Neustadt, L.L.P.

(57) ABSTRACT

A charged particle beam writing apparatus includes a plurality of tracking calculation units to calculate a deflection amount of the charged particle beam in regard to a movable substrate, a switching unit for each of a plurality of virtual small regions of the substrate, to input an end signal indicating completion of charged particle beam emission to a respective small region, and to switch from output of one of the tracking calculation units to output of another of the tracking calculation units, and a deflector, while a substrate is moving, to deflect the charged particle beam to an n-th small region, based on an output from one of the tracking calculation units before switching and to deflect the charged particle beam to an (n+1)th small region based on an output from another of tracking calculation units after switching the plurality of tracking calculation units.

10 Claims, 6 Drawing Sheets

U.S. PATENT DOCUMENTS

| | | | |
|---|---|---|---|
| 2009/0134343 A1* | 5/2009 | Inoue | 250/492.22 |
| 2009/0272911 A1* | 11/2009 | Goshima | 250/396 R |
| 2010/0030522 A1* | 2/2010 | Tsuchiya et al. | 702/183 |
| 2010/0173235 A1* | 7/2010 | Kato et al. | 430/30 |
| 2010/0288939 A1* | 11/2010 | Nishimura | 250/397 |
| 2011/0066272 A1* | 3/2011 | Anpo | 700/103 |
| 2012/0007002 A1 | 1/2012 | Nakayamada et al. | |
| 2012/0211676 A1* | 8/2012 | Kamikubo | 250/492.22 |
| 2012/0248340 A1* | 10/2012 | Inoue | 250/492.3 |
| 2012/0252215 A1* | 10/2012 | Abe | 438/694 |
| 2012/0286174 A1* | 11/2012 | Gomi et al. | 250/492.3 |
| 2012/0292536 A1* | 11/2012 | Yashima et al. | 250/492.22 |
| 2012/0292537 A1* | 11/2012 | Yashima et al. | 250/492.22 |

* cited by examiner

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2011-009812 filed on Jan. 20, 2011 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to an apparatus that transmits deflection data by optical transmission in electron beam writing.

2. Description of Related Art

The microlithography technique which advances micro-miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 7 is a schematic diagram explaining operations of a variable-shaped electron beam (EB) writing apparatus. As shown in the figure, the variable-shaped electron beam writing apparatus operates as described below. A first aperture plate 410 has a quadrangular, such as a rectangular, opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method. (For example, refer to Japanese Unexamined Patent Publication No. 2007-043083.)

In the electron beam writing, writing is performed per subfield (SF) which is obtained by dividing the writing region of the substrate into meshes. Since the number of SFs increases with the recent miniaturization of patterns, further improvement is required in speed and precision of processing deflection data concerning deflection to SF. For example, when transmitting a deflection signal from a control circuit by optical transmission, there occurs a communication delay. On the other hand, when irradiating with an electron beam an SF in the mask substrate on the stage which is moving, tracking processing needs to be performed in accordance with the movement of the stage, and thereby it needs to perform deflection to the tracked position. When the writing processing in one SF has been completed, tracking of the next SF position is started. Therefore, if there is a communication delay, writing processing for the next SF will be delayed, thereby causing an increase in the writing time, which degrades the throughput of the writing apparatus.

BRIEF SUMMARY OF THE INVENTION

In accordance with one aspect of the present invention, a charged particle beam writing apparatus includes an emission unit configured to emit a charged particle beam, a stage on which a substrate serving as a writing target is placed and which is movable, a plurality of tracking calculation units each configured to calculate a deflection amount of the charged particle beam, for following movement of the stage, while having a calculation time difference wherein there exists a mutual overlapping time period, a switching unit configured, for each small region of a plurality of small regions made by virtually dividing a surface of the substrate, to input an end signal indicating that emission of the charged particle beam to a small region concerned has been completed, and to switch, using the end signal as a trigger, from output of one of the plurality of tracking calculation units to output of another of the plurality of tracking calculation units, and a deflector configured, while the stage is moving, to deflect the charged particle beam to an n-th small region, based on a signal output from one of the plurality of tracking calculation units before switching the plurality of tracking calculation units, and to deflect the charged particle beam to an (n+1)th small region, based on a signal output from another of the plurality of tracking calculation units after switching the plurality of tracking calculation units.

In accordance with another aspect of the present invention, a charged particle beam writing method includes emitting a charged particle beam, calculating, by a plurality of tracking calculation units, deflection amounts of the charged particle beam, for following movement of a stage on which a substrate serving as a writing target is placed, while having a calculation time difference wherein there exists a mutual overlapping time period, inputting, for each small region of a plurality of small regions made by virtually dividing a surface of the substrate, an end signal indicating that the emitting of the charged particle beam to a small region concerned has been completed, and switching, using the end signal as a trigger, from output of one of the plurality of tracking calculation units to output of another of the plurality of tracking calculation units, deflecting, while the stage is moving, the charged particle beam to an n-th small region, based on a signal output from one of the plurality of tracking calculation units before switching the plurality of tracking deflection amount calculation units, and deflecting, while the stage is moving, the charged particle beam to an (n+1)th small region, based on a signal output from another of the plurality of tracking calculation units after switching the plurality of tracking calculation units.

DETAILED DESCRIPTION OF THE INVENTION

Embodiment 1

In Embodiment 1, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

In Embodiment 1, there will be described an apparatus and a method capable of inhibiting throughput degradation due to a communication delay of a deflection signal.

Figure 1:
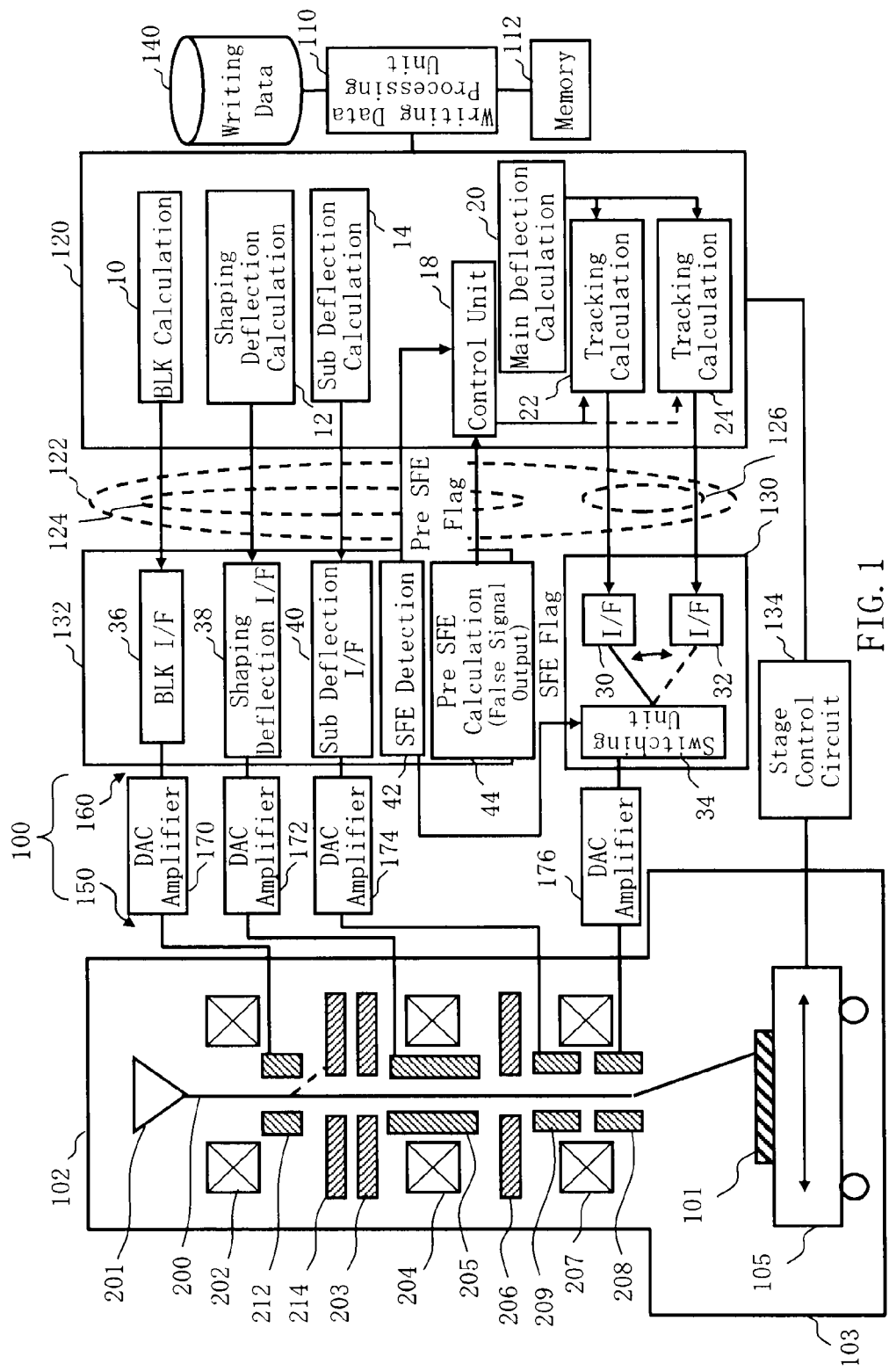
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 (or drawing apparatus 100) is an example of a charged particle beam writing apparatus, and especially, an example of a variable-shaped beam (VSB) writing apparatus. The writing apparatus 100 writes (or draws) a pattern on a target workpiece by using an electron beam. The writing unit 150 includes an electron lens barrel 102 and a writing chamber 103. In the electron lens barrel 102, there are arranged an electron gun assembly 201, an illumination lens 202, a blanking (BLK) deflector 212, a blanking aperture 214, a first shaping aperture 203, a projection lens 204, a deflector 205, a second shaping aperture 206, an objective lens 207, a main deflector 208, and a sub deflector 209. In the writing chamber 103, there is arranged an XY stage 105 movable in at least the X and Y directions. On the XY stage 105, there is placed a target workpiece 101 serving as a writing target. The target workpiece 101 (substrate) is, for example, a mask for exposure, a silicon wafer, etc. used for manufacturing semiconductor devices. The mask is, for example, a mask blank where no patterns are formed. Resist has been applied to the surface of the target workpiece 101.

The control unit 160 includes a control computer 110, a memory 112, a deflection control circuit 120, relay units 130 and 132, a stage control circuit 134, a storage device 140 such as a magnetic disk drive, and digital-to-analog conversion (DAC) amplifiers 170, 172, 174, and 176. The control computer 110, the memory 112, the deflection control circuit 120, the stage control circuit 134, and the storage device 140 such as a magnetic disk drive are mutually connected through a bus (not shown). The deflection control circuit 120 is connected to the relay units 130 and 132 by an optical cable 122. The optical cable 122 includes optical cables 124 and 126. The deflection control circuit 120 is connected to the relay unit 132 (first relay unit) by the optical cable 124 (first optical cable). The deflection control circuit 120 is connected to the relay unit 130 (second relay unit) by the optical cable 126 (second optical cable). The relay units 130 and 132 are connected with each other. The relay unit 132 is connected to the blanking deflector 212 through the DAC amplifier 170, to the deflector 205, which is used for shaping purposes, through the DAC amplifier 172, and to the sub deflector 209 through the DAC amplifier 174. The relay unit 130 is connected to the main deflector 208 through the DAC amplifier 176.

In the deflection control circuit 120, there are arranged a BLK calculation unit 10, a shaping deflection calculation unit 12, a sub deflection calculation unit 14, a control unit 18, a main deflection calculation unit 20, and two or more (a plurality of) tracking calculation units 22 and 24 (tracking deflection amount calculation units). Each function, such as the BLK calculation unit 10, the shaping deflection calculation unit 12, the sub deflection calculation unit 14, the control unit 18, the main deflection calculation unit 20, and the two or more tracking calculation units 22 and 24 may be configured by software such as a program, or may be configured by hardware such as an electronic circuit. Alternatively, it may be configured by a combination of software and hardware. Input data necessary for the deflection control circuit 120 and a calculated result are stored in the memory (not shown) each time.

In the relay unit 130, there are arranged two or more (a plurality of) main deflection I/F circuits 30 and 32 and a switching unit 34.

In the relay unit 132, there are arranged a blanking (BLK) I/F circuit 36, a shaping deflection I/F circuit 38, a sub deflection I/F circuit 40, a subfield end (SFE) detection unit 42, and a pre subfield end (PreSFE) calculation unit 44.

In the storage device 140, writing data necessary for writing, such as a pattern layout, a figure code, and coordinates, is input from the outside to be stored.

FIG. 1 shows a structure necessary for describing Embodiment 1. Other structure elements generally necessary for the writing apparatus 100 may also be included. For example, although the main and sub two stage deflectors, namely the main deflector 208 and the sub deflector 209 are herein used, a one stage deflector or a three (or more) stage deflector may also be used to perform deflection to a predetermined position of the target workpiece.

In the pattern input step, the control computer 110 inputs writing data stored in the storage device 140.

The control computer 110 performs data conversion processing of a plurality of steps for the writing data input from the storage device 140, and generates shot data unique to the writing apparatus. The control computer 110 functions as a writing data processing unit. The control computer 110 converts a plurality of figure patterns defined in the writing data into shot figures each having the size which can be irradiated (which can be shaped) by a one-time shot of an electron beam 200. Then, shot data is generated in which there are defined a dose, an irradiation position, a type, a size, etc. of each shot figure. Input data necessary for the control computer 110 and a calculated result are stored in the memory 112 each time.

Then, the generated shot data is output to the deflection control circuit 120. In accordance with the shot data, in the deflection control circuit 120, the BLK calculation unit 10 performs calculation to generate BLK deflection data which is for alternately producing a beam-ON state and a beam-OFF state so that the beam-ON state may be maintained only for a defined dose (only during a defined deflection time period).

The generated BLK deflection data is output to the relay unit 132 through the optical cable 122.

Moreover, in accordance with the shot data, the shaping deflection calculation unit 12 performs calculation to generate shaping deflection data which is for variably shaping the beam shape and the beam size of each shot of the electron beam 200 generated in the beam-ON state. The generated shaping deflection data is output to the relay unit 132 through the optical cable 122.

The writing region of the target workpiece 101 is virtually divided into a plurality of strip-like stripe regions in the X or Y direction, each having a width deflectable by the main deflector 208. Further, the stripe region is virtually divided into subfields (SFs) deflectable by the sub deflector 209. In accordance with the shot data, the sub deflection calculation unit 14 performs calculation to generate deflection data (sub deflection data) which is for deflecting the electron beam 200 from the reference position of the SF concerned to each shot position in each SF. The generated sub deflection data is output to the relay unit 132 through the optical cable 122.

Moreover, in accordance with the shot data, the main deflection calculation unit 20 performs calculation to generate deflection data (main deflection data) which is for deflecting the electron beam 200 to each SF. The generated main deflection data is output to the tracking calculation units 22 and 24.

When performing writing onto the target workpiece 101, since the XY stage 105 moves, the two or more tracking calculation units 22 and 24 perform calculation to generate deflection data for tracking, that is tracking data, to be used by the main deflector 208 which performs deflection to follow the movement of the XY stage 105. The position of the XY stage 105 may be input from the stage control circuit 134, for example. According to Embodiment 1, the tracking calculation units 22 and 24 alternately calculate tracking data of each SF, such as calculating tracking data of the n-th SF by the tracking calculation unit 22 and calculating tracking data of the (n+1)th SF by the tracking calculation unit 24. For each SF, main deflection data and tracking data concerned are output to the relay unit 130 through the optical cable 122. Tracking data of each of the tracking calculation units 22 and 24 is: (tracking data)=(main deflection data−stage position data). Since the main deflection data is set up for each SF, the offset of each SF is different. Therefore, it is more preferable to perform tracking calculation for the n-th SF and the (n+1)th SF by a plurality of tracking calculation units 22 and 24.

In the relay unit 132, BLK deflection data is output to the DAC amplifier 170 through the blanking I/F circuit 36. Then, the BLK deflection data is converted to an analog signal from the digital signal by the DAC amplifier 170 to be amplified and applied as a deflection voltage to the BLK deflector 212.

Moreover, shaping deflection data is output to the DAC amplifier 172 through the shaping deflection I/F circuit 38. Then, the shaping deflection data is converted to an analog signal from the digital signal by the DAC amplifier 172 to be amplified and applied as a deflection voltage to the deflector 205 which is used for shaping purposes.

Moreover, sub deflection data is output to the DAC amplifier 174 through the sub deflection I/F circuit 40. Then, the sub deflection data is converted to an analog signal from the digital signal by the DAC amplifier 174 to be amplified and applied as a deflection voltage to the sub deflector 209.

On the other hand, in the relay unit 130, the main deflection data and the tracking data output from the tracking calculation unit 22 are output to the main deflection I/F circuit 30, and the main deflection data and the tracking data output from the tracking calculation unit 24 are output to the main deflection I/F circuit 32. The switching unit 34 switches the connection between the DAC amplifier 176 and the main deflection I/F circuits 30 and 32 so that the main deflection data and the tracking data may be output to the DAC amplifier 176 through one of the main deflection I/F circuits 30 and 32. Then, the data of added main deflection data to tracking data is converted to an analog signal from the digital signal by the DAC amplifier 176 to be amplified, thereby being applied as a deflection voltage to the main deflector 208.

The writing unit 150 writes a pattern onto the target workpiece 101 by using the electron beam 200. Specifically, the following operation is performed.

When passing through the blanking deflector 212, the electron beam 200 emitted from the electron gun assembly 201 (emission unit) is controlled by the blanking deflector 212 to pass through the blanking aperture 214 when the beam is in the ON state, and is deflected so that the entire beam may be blocked by the blanking aperture 214 when the beam is in the OFF state. The electron beam 200 passing through the blanking aperture 214, while changing the state from beam-OFF to beam-ON and lastly again to beam-OFF, serves as one shot of the electron beam. The blanking deflector 212 controls the direction of the passing electron beam 200 to alternately generate the beam-ON state and the beam-OFF state. For example, it is acceptable to apply a voltage to the blanking deflector 212 when in the beam-OFF state and not to apply a voltage when in the beam-ON state. The dose per shot of the electron beam 200 to irradiate the target workpiece 101 is adjusted based on the irradiation time of each shot.

As described above, each shot of the electron beam 200, generated by passing through the blanking deflector 212 and the blanking aperture 214, irradiates the whole of the first shaping aperture 203 which has a quadrangular opening such as a rectangular opening by the illumination lens 202. At this time, the electron beam 200 is first shaped to be a quadrangle such as a rectangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the deflector 205 to change the shape and size of the beam, that is, the variable beam shaping is performed. Such variable beam shaping is performed for each shot, and, usually, each of the shots is shaped to have a different shape and size. Then, after having passed through the second shaping aperture 206, the electron beam 200 of a second aperture image is focused by the objective lens 207, and deflected by the main deflector 208 and the sub deflector 209 to reach a desired position on the target workpiece 101 placed on the XY stage 105 which moves continuously. First, the main deflector 208 deflects the electron beam 200 to the reference position in the SF to be shot. Since the XY stage 105 is moving, the main deflector 208 deflects the electron beam 200 such that the movement of the XY stage 105 is followed. Then, each position (shot position) in the SF is irradiated by the sub deflector 209.

Figure 2:
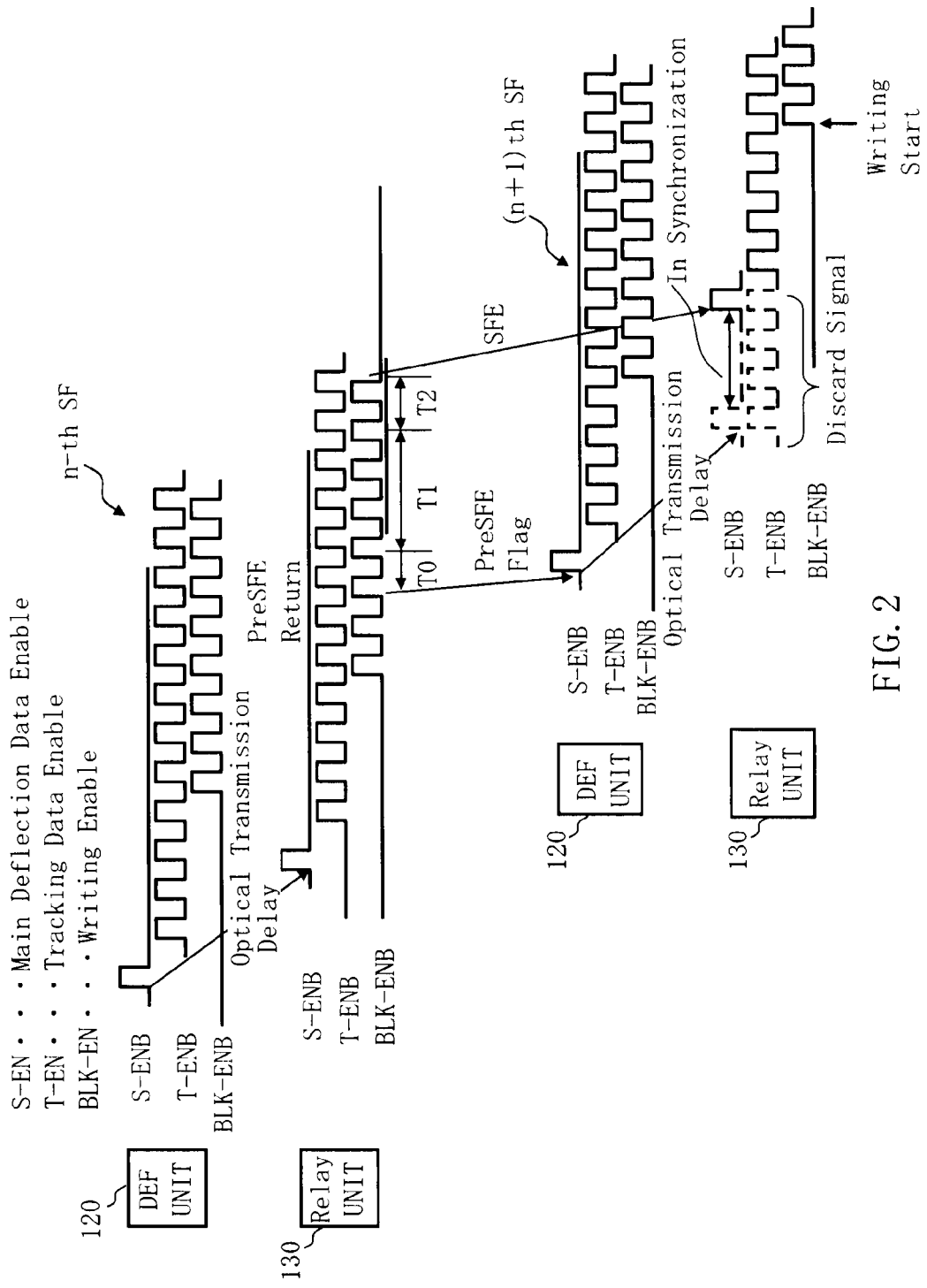
FIG. 2 is a time chart of signals in a deflection control circuit and a relay unit according to Embodiment 1.

FIG. 2 shows a time chart of signals in the deflection control circuit and the relay unit according to Embodiment 1. In FIG. 2, for example, for the n-th SF, the main deflection data and the tracking data following the main deflection data are output from the deflection control circuit 120. Then, after waiting for the settling time of the DAC amplifier 176 for the main deflection, the BLK deflection data is output. Since the deflection control circuit 120 and the relay units 130 and 132 are connected by the optical cable 122, a delay (time T1) is generated in the signal transmission. Therefore, the main deflection data and the tracking data from the deflection control circuit 120 are delayed by the time T1 to reach the relay unit 130. Similarly, the BLK deflection data is delayed by the time T1 to reach the relay unit 132. When the settling time of the DAC amplifier 176 has passed and the deflection voltage to be applied to the main deflector 208 is stabilized, the BLK deflector 212 generates an "on" beam for each shot, based on ON or OFF of the deflection voltage from the DAC amplifier 170. Then, a shot figure is written for each shot by shaping the electron beam for the shot concerned by the deflector 205 and emitting the shaped electron beam to the shot position concerned in the SF by the sub deflector 209. By combining such shot figures, a pattern in the SF is written onto the target workpiece 101. When the writing to the n-th SF is completed, the SFE detection unit 42 detects the completion of the writing to the n-th SF and outputs a subfield end (SFE) signal (SFE flag).

When the writing to the n-th SF has been completed and writing to the next SF, namely the (n+1)th SF, is going to be performed, if such an SFE signal is waited, the following problem will occur.

Figure 3:
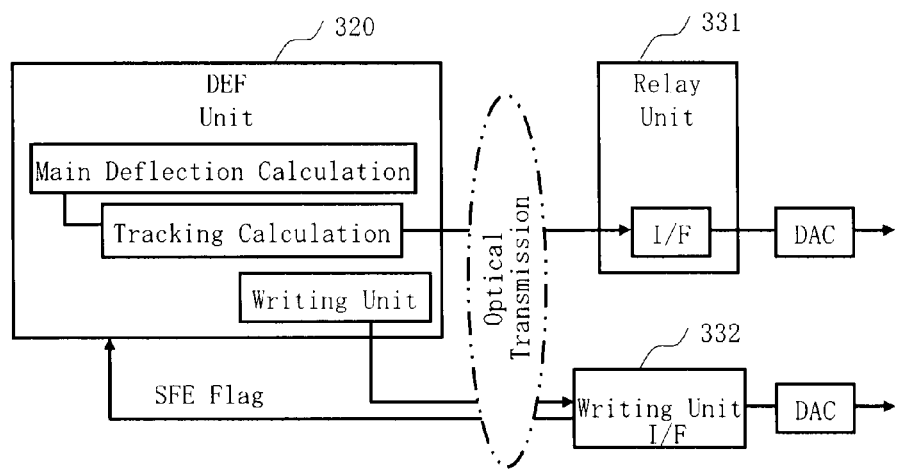
FIG. 3 is a schematic diagram, for comparing with Embodiment 1, showing a structure in the case there is only one tracking calculation unit and there is no signal switching function in a relay unit for the main deflection.

FIG. 3 is a schematic diagram, for comparing with Embodiment 1, showing a structure in the case there is only one tracking calculation unit and there is no signal switching function in the relay unit for the main deflection. In FIG. 3, a deflection control circuit 320 and relay units 331 and 332 are connected by an optical cable similarly to the case of FIG. 1. In the structure of FIG. 3, the deflection control circuit 320 receives an SFE flag for the n-th SF from the relay unit 332 side, and starts writing processing for the (n+1)th SF.

Figure 4:
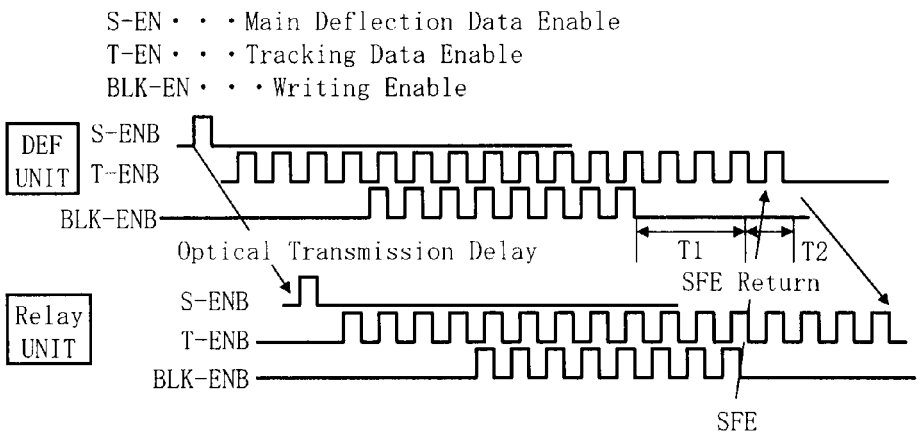
FIG. 4 shows, for comparing with Embodiment 1, an example of a time chart of signals in a deflection control circuit and a relay unit in the case there is only one tracking calculation unit and there is no signal switching function in the relay unit for the main deflection.

FIG. 4 shows, for comparing with Embodiment 1, an example of a time chart of signals in the deflection control circuit and the relay unit in the case there is only one tracking calculation unit and there is no signal switching function in the relay unit for the main deflection. In FIG. 4, for the n-th SF, the main deflection data and the tracking data following the main deflection data are output from the deflection control circuit 320 side. Then, after waiting for the settling time of the DAC amplifier 176 for the main deflection, the BLK deflection data is output. Since the deflection control circuit 320 and the relay unit 331 are connected by the optical cable, the delay (time T1) is generated in the signal transmission. Therefore, the main deflection data and the tracking data from the deflection control circuit 320 are delayed by the time T1 to reach the relay unit 331. When the settling time of the DAC amplifier 176 has passed and the deflection voltage to be applied to the main deflector is stabilized, the BLK deflector generates an "on" beam for each shot, based on ON or OFF of the deflection voltage from the DAC amplifier 170. Then, a beam is shaped for each shot, and the shaped electron beam is emitted to the shot position concerned. Since it takes a time T2, as a transmission delay of the optical cable, for the SFE flag to reach the deflection control circuit 320 from the relay unit 332, even after the BLK deflection data for the n-th SF is finished, it is still necessary to continue to calculate and output the tracking data for the time period of T1+T2. This is because if tracking is finished before completing the writing to the n-th SF, the writing position will be shifted. Accordingly, in spite of the tracking data for writing the n-th SF being actually enough, it continues to calculate the data, thereby generating a problem of a delay of starting calculation for the next SF.

Figure 5:
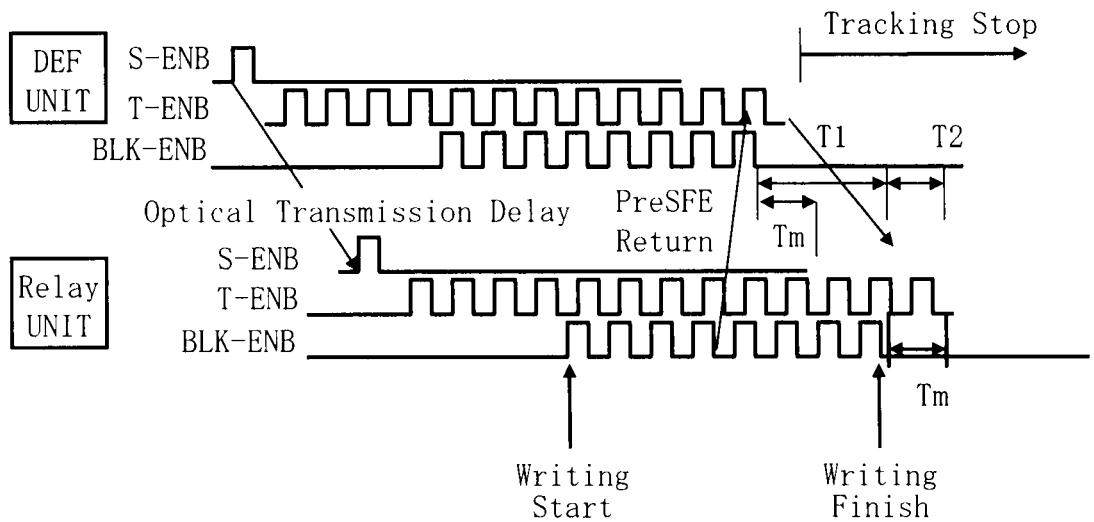
FIG. 5 shows, for comparing with Embodiment 1, another example of the time chart of signals in the deflection control circuit and the relay unit in the case there is only one tracking calculation unit and there is no signal switching function in the relay unit for the main deflection.

FIG. 5 shows, for comparing with Embodiment 1, another example of the time chart of signals in the deflection control circuit and the relay unit in the case there is only one tracking calculation unit and there is no signal switching function in the relay unit for the main deflection. In the case of FIG. 4, since the SFE flag is waited, calculation start for the next SF is delayed by the time period of T1+T2. Then, in the case of FIG. 5, before the writing to the n-th SF is completed, a pre SFE flag is output to the deflection control circuit 320 from the relay unit 332 in advance anticipating the time delay T1+T2. In the present case, using a margin time Tm, the relay unit 332 outputs a pre SFE flag to the deflection control circuit 320 at the time prior to the completion of the writing by (T1+T2−Tm). Originally, since the SFE is not synchronized with the main deflection data or the tracking data, it is needed to set a margin time Tm that can be obtained by considering a time delay of an optical communication module, jitter, skew, etc. and multiplying by a safety coefficient. Thus, in the deflection control circuit 320, the calculation of tracking data can be finished in response to the pre SFE flag, thereby reducing the unnecessary time. However, according to the method of FIG. 5, there occurs a problem that if making a mistake in estimating the setting of the margin time Tm, tracking data will stop before completing the writing.

Then, in Embodiment 1, as shown in FIG. 1, a plurality of tracking calculation units are arranged in the deflection control circuit 120, and a signal switching function is arranged in the relay unit 130 for the main deflection. As shown in FIG. 2, before the writing to the n-th SF is completed, a pre SFE flag is output to the deflection control circuit 120 from the relay unit 130 in advance, anticipating the time delay T1+T2. In the present case, the PreSFE calculation unit 44 in the relay unit 132 generates a pre SFE flag at the time prior to the completion of the writing by T1+T2+T0 by using the margin time T0, and outputs it to the deflection control circuit 120 from the relay unit 132. In other words, the PreSFE calculation unit 44 outputs to each SF (small region) a pre SFE flag, which is a false signal of the SFE flag being an end signal, before the emission of the electron beam to the SF concerned is completed. The PreSFE calculation unit 44 serves as an example of a false signal output unit.

In the deflection control circuit 120, in response to the pre SFE flag, the control unit 18 makes the main deflection calculation unit 20 start to calculate main deflection data for the (n+1)th SF. Furthermore, the control unit 18 makes, for example, another tracking calculation unit 24, which is different from the tracking calculation unit 22 currently tracking the n-th SF, start to calculate tracking data for the (n+1)th SF. Then, the main deflection data and the tracking data following the main deflection data are output from the deflection control circuit 120 to the relay unit 130. Since the deflection control circuit 120 and the relay unit 130 are connected by the optical cable 122, a delay (time T1) is generated in the signal transmission. Therefore, the main deflection data and the tracking data are delayed by the time T1 to reach the relay unit 130 from the deflection control circuit 120. At this moment, the writing of the n-th SF has not been completed yet. Therefore, the two or more tracking calculation units 22 and 24 calculate tracking data used as a deflection amount of the electron beam, for following the movement of the XY stage 105, while having a calculation time difference wherein there exists a their mutual overlapping time period. Moreover, in response to the pre SFE flag, the control unit 18 controls the BLK calculation unit 10, the shaping deflection calculation unit 12, and the sub deflection calculation unit 14 to respectively calculate BLK deflection data, shaping deflection data, and subdeflection data for each shot in the (n+1)th SF. Then, the BLK deflection data, the shaping deflection data, and the shaping deflection data are output to the relay unit 132 from the deflection control circuit 120. Since the BLK deflection data, the shaping deflection data, and the subdeflection data are also connected by the optical cable 122, a delay (time T1)

is generated in the signal transmission. Therefore, it is delayed by the time T1 to reach the relay unit 132 from the deflection control circuit 120.

The switching unit 34 in the relay unit 130 inputs the SFE flag output from the SFE detection unit 42 in the relay unit 132, and, using the SFE flag as a trigger, switches the connection from the output of the tracking calculation units 22 to the output of the tracking calculation unit 24. By this, switching is immediately performed from the main deflection data for the n-th SF and its tracking data to the main deflection data for the (n+1)th SF and its tracking data. After the settling time of the DAC amplifier 176 has passed since the main deflection data for the (n+1)th SF, in the state before switching the connection, reached the relay unit 130, the BLK deflector 212 generates an "on" beam for each shot in the (n+1)th SF, based on ON or OFF of the deflection voltage from the DAC amplifier 170. Then, for each shot, an electron beam for the shot concerned is shaped by the deflector 205, and the shaped electron beam is emitted to the shot position concerned in the (n+1)th SF by the sub deflector 209. Thus, in this way a shot figure is written. By combining such shot figures, a pattern in the (n+1)th SF is written to the target workpiece 101. After completing the writing to the (n+1)th SF, the SFE detection unit 42 detects the completion of the writing to the (n+1)th SF, and outputs an SFE signal (SFE flag). A similar operation will be performed hereafter.

The time period since the main deflection data for the (n+1)th SF, in the state before switching the connection, reached the relay unit 130 until the SFE flag reaches the relay unit 130 is several hundreds of nS, which is sufficiently short for the settling time necessary for the DAC amplifier 176 for the main deflection. Therefore, even starting the writing of the (n+1)th SF when the settling time of the DAC amplifier 176 has passed since the main deflection data for the (n+1)th SF, in the state before switching the connection, reached the relay unit 130, the deflection voltage to be applied to the main deflector 208 can be in a stabilized state.

Figure 6:
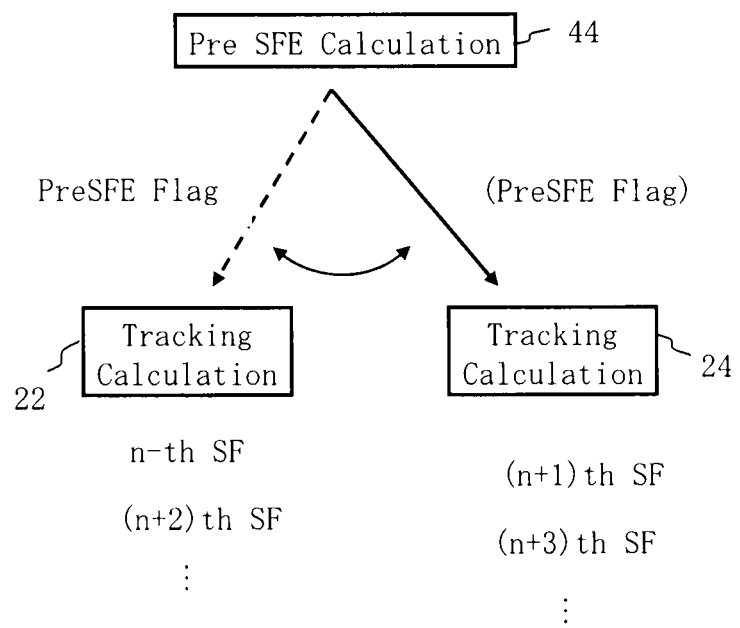
FIG. 6 is a schematic diagram explaining an alternate calculation in Embodiment 1.
Figure 7:
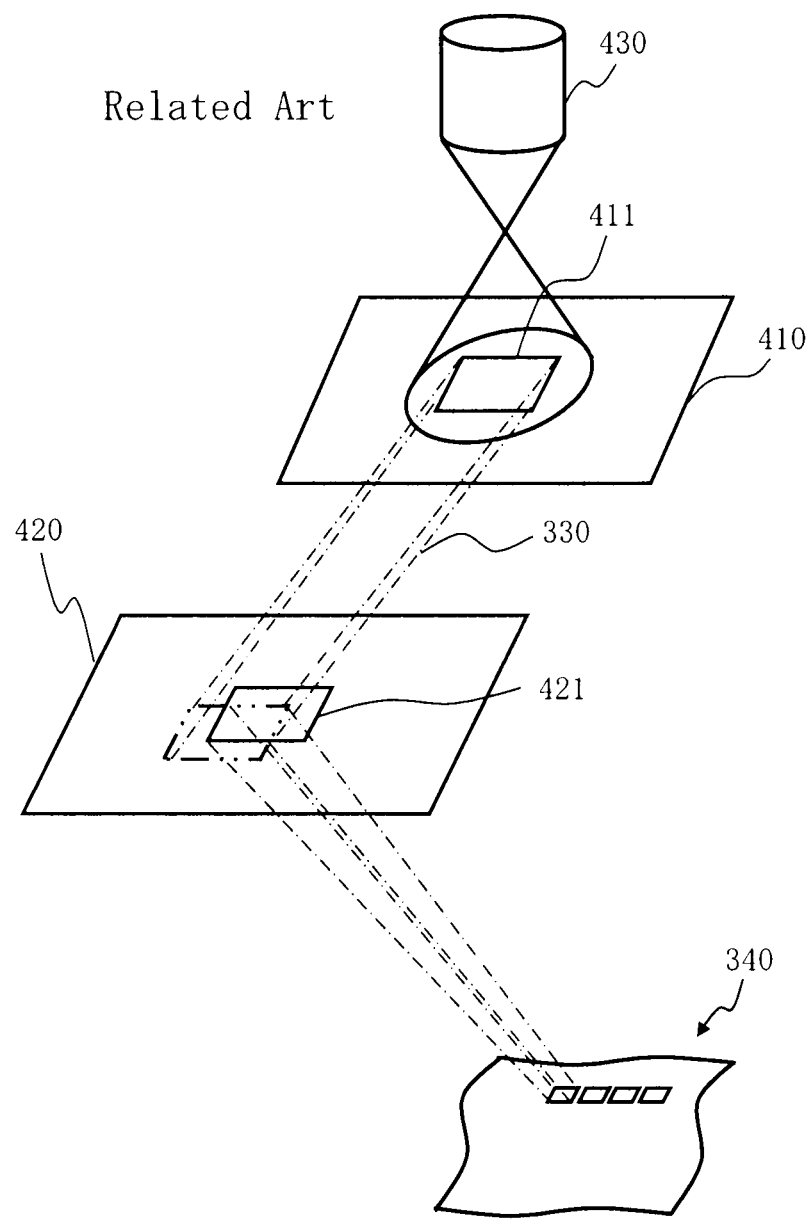
FIG. 7 is a schematic diagram explaining operations of a variable-shaped electron beam writing apparatus.

FIG. 6 is a schematic diagram explaining an alternate calculation in Embodiment 1. As described above, the two or more tracking calculation units 22 and 24 input the pre SFE flag which serves as a false signal from the PreSFE calculation unit 44, and using the pre SFE flag as a trigger, alternately start tracking calculation. Then, the switching unit 34, for each SF, inputs an SFE flag indicating that emission of the electron beam to the SF concerned has been completed, and using the SFE flag as a trigger, switches the connection with the DAC amplifier 176 from output of one of a plurality of tracking calculation units 22 and 24 to output of another of the units 22 and 24. While the XY stage 105 is moving, the main deflector 208 deflects the electron beam 200 to the n-th SF, based on a signal output from one of the plurality of tracking calculation units 22 and 24 before switching the plurality of tracking calculation units. Then, the sub deflector 209 respectively deflects the beam of a shot concerned to each shot position in the n-th SF. Next, after switching, the main deflector 208 deflects the electron beam 200 to the (n+1)th SF, based on a signal output from another of the plurality of tracking calculation units 22 and 24. Then, the sub deflector 209 respectively deflects the beam of a shot concerned to each shot position in the (n+1)th SF.

During the time between receiving the SFE flag for the n-th SF and switching the connection by the switching unit 34, the tracking data for the (n+1)th SF generated in response to the pre SFE flag is not used as being a so-called discard signal. However, it becomes possible to eliminate a unnecessary standby time by having an overlapped time period of the tracking data for the n-th SF and the tracking data for the (n+1)th SF. Therefore, the margin Tm needed in order not to stop the tracking data during the writing, which has been explained with reference to FIG. 5, can also be unnecessary.

As described above, according to Embodiment 1, it is possible to inhibit lowering of the deflection processing speed even if there is a communication delay of a deflection signal, such as the case of using an optical cable etc. for connection. Therefore, it is possible to inhibit decrease of the throughput of the writing apparatus.

Referring to specific examples, Embodiment has been described above. However, the present invention is not limited to these examples. For example, although the optical cable is used in the example mentioned above, it is not limited to it, and any connection having a communication delay can be applied.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   an emission unit configured to emit a charged particle beam;
   a stage on which a substrate serving as a writing target is placed and which is movable;
   a plurality of tracking calculation units each configured to calculate a deflection amount of the charged particle beam, for following movement of the stage, while having a calculation time difference wherein there exists a mutual overlapping time period;
   a switching unit configured, for each small region of a plurality of small regions made by virtually dividing a surface of the substrate, to input an end signal indicating that emission of the charged particle beam to a small region concerned has been completed, and to switch, using the end signal as a trigger, from output of one of the plurality of tracking deflection amount calculation units to output of another of the plurality of tracking deflection amount calculation units; and
   a deflector configured, while the stage is moving, to deflect the charged particle beam to an n-th small region, based on a signal output from one of the plurality of tracking deflection amount calculation units before switching the plurality of tracking deflection amount calculation units, and to deflect the charged particle beam to an (n+1)th small region, based on a signal output from another of the plurality of tracking deflection amount calculation units after switching the plurality of tracking calculation units.

2. The apparatus according to claim 1, further comprising:
a false signal output unit configured, for each small region, to output a false signal of the end signal before emission of the charged particle beam to a small region concerned is completed,
wherein the plurality of tracking calculation units input the false signal, and, using the false signal as a trigger, alternately start the to calculate.

3. The apparatus according to claim 1, wherein
the plurality of tracking calculation units and the switching unit are connected by an optical cable.

4. The apparatus according to claim 1, wherein
the deflector is configured by a multistage deflector, being two stages of a main deflector and a sub deflector,
wherein the main deflector deflects, for each small region, the charged particle beam to a reference position of a small region concerned while following movement of the stage, and
the sub deflector deflects the charged particle beam to each shot position in the small region concerned.

5. The apparatus according to claim 1, further comprising:
a detection unit configured, for each small region, to detect completion of writing to a small region concerned when the writing of the small region concerned has been completed, and to output the end signal.

6. The apparatus according to claim 2, further comprising:
a first relay unit configured to include the false signal output unit; and
a second relay unit configured to include the switching unit,
wherein the plurality of tracking calculation units are connected to the first relay unit through a first optical cable, and
the plurality of tracking calculation units are connected to the second relay unit through a second optical cable.

7. A charged particle beam writing method comprising:
emitting a charged particle beam;
calculating, by a plurality of tracking calculation units, deflection amounts of the charged particle beam, for following movement of a stage on which a substrate serving as a writing target is placed, while having a calculation time difference wherein there exists a mutual overlapping time period;
inputting, for each small region of a plurality of small regions made by virtually dividing a surface of the substrate, an end signal indicating that the emitting of the charged particle beam to a small region concerned has been completed, and switching, using the end signal as a trigger, from output of one of the plurality of tracking calculation units to output of another of the plurality of tracking calculation units;
deflecting, while the stage is moving, the charged particle beam to an n-th small region, based on a signal output from one of the plurality of tracking calculation units before switching the plurality of tracking calculation units; and
deflecting, while the stage is moving, the charged particle beam to an (n+1)th small region, based on a signal output from another of the plurality of tracking calculation units after switching the plurality of tracking calculation units.

8. The method according to claim 7, further comprising:
outputting, for each small region, a false signal of the end signal before the emitting of the charged particle beam to a small region concerned is completed,
wherein the deflection amounts of the charged particle beam is, using the false signal as a trigger, started to be alternately calculated by the plurality of tracking calculation units.

9. The method according to claim 7, wherein
the charged particle beam is deflected, for each small region, to a reference position of a small region concerned while following movement of the stage, based on a signal output from one of the plurality of tracking calculation units.

10. The method according to claim 7, further comprising:
detecting, for each small region, when writing to a small region concerned has been completed, a completion of the writing to the small region concerned, and outputting the end signal.

* * * * *